United States Patent
Dekempeneer et al.

(10) Patent No.: US 8,192,597 B2
(45) Date of Patent: Jun. 5, 2012

(54) COATING APPARATUS

(75) Inventors: Erik Dekempeneer, Oostmalle (BE);
Wilmert De Bosscher, Drongen (BE);
Pascal Verheyen, Gavere (BE)

(73) Assignee: NV Bekaert SA, Zwevegem (BE)

( * ) Notice: Subject to any disclaimer, the term of this patent is extended or adjusted under 35 U.S.C. 154(b) by 889 days.

(21) Appl. No.: 12/293,880

(22) PCT Filed: Mar. 14, 2007

(86) PCT No.: PCT/EP2007/052375
§ 371 (c)(1),
(2), (4) Date: Sep. 22, 2008

(87) PCT Pub. No.: WO2007/110323
PCT Pub. Date: Oct. 4, 2007

(65) Prior Publication Data
US 2009/0130336 A1 May 21, 2009

(30) Foreign Application Priority Data
Mar. 28, 2006 (EP) .................................. 06111845

(51) Int. Cl.
*C23C 14/35* (2006.01)
(52) U.S. Cl. ......... 204/298.11; 204/298.14; 204/298.21; 204/298.22
(58) Field of Classification Search ............. 204/298.11, 204/298.14, 298.21, 298.22
See application file for complete search history.

(56) References Cited

U.S. PATENT DOCUMENTS

| | | | |
|---|---|---|---|
| 4,080,281 A | 3/1978 | Endo | |
| 5,108,574 A * | 4/1992 | Kirs et al. | 204/298.22 |
| 5,215,638 A | 6/1993 | Hausler | |
| 5,645,699 A * | 7/1997 | Sieck | 204/192.12 |
| 5,690,796 A | 11/1997 | DuPont et al. | |
| 6,171,454 B1 * | 1/2001 | Weber et al. | 204/192.12 |
| 6,264,803 B1 | 7/2001 | Morgan et al. | |
| 6,488,824 B1 * | 12/2002 | Hollars et al. | 204/192.22 |
| 6,740,393 B1 | 5/2004 | Massler et al. | |
| 7,160,616 B2 | 1/2007 | Massler et al. | |
| 2002/0063054 A1 * | 5/2002 | Marshall | 204/192.12 |

FOREIGN PATENT DOCUMENTS

| | | | |
|---|---|---|---|
| JP | 60-262969 A | | 12/1985 |
| JP | 09-316633 | * | 12/1997 |
| JP | 2004-43934 A | | 2/2004 |
| WO | WO 01/79585 A1 | | 10/2001 |

* cited by examiner

*Primary Examiner* — Rodney McDonald
(74) *Attorney, Agent, or Firm* — Foley & Lardner LLP (57) ABSTRACT

A coating apparatus (100) for batch coating of substrates is presented. In the batch coater layers of a stack can be deposited by means of physical vapor deposition, by means of chemical vapor deposition or by a mixture of both processes. When compared to previous apparatus, the mixed mode process is particularly stable. This is achieved by using a rotatable magnetron (112) rather than the prior-art planar magnetrons. The apparatus is further equipped with a rotatable shutter that allows for concurrent or alternating process steps.

19 Claims, 4 Drawing Sheets

COATING APPARATUS

FIELD OF THE INVENTION

The invention relates to a coating apparatus particularly intended for mixed mode coating processes in which physical vapour deposition (PVD) processes alternate with chemical vapour deposition (CVD) processes or are effected simultaneously. In the apparatus a rotatable magnetron is used as a sputter material source. The coating apparatus is further equipped with a tubular shutter that can be rotatably moved so as to cover or uncover the sputter zone of the magnetron.

BACKGROUND OF THE INVENTION

In the art of deposition of optically, electrically, chemically, magnetically or mechanically functional coatings, the physical vapour deposition (PVD) and the chemical vapour deposition (CVD) prevail. Physical vapour deposition relates to processes wherein the coating is built-up by a ballistic shower of the substrate with coating atoms. The coating atoms originate from a usually solid, sometimes liquid 'target'. A preferred way of transferring the target material to the substrate is to bombard the target surface with high kinetic energy ions. A plasma of an inert gas—typically a noble gas such as argon—acts as a source of ions. The ions gain kinetic energy as they are accelerated towards the negatively biased target and eject the target material atoms towards the substrate. Such a process is called 'sputter deposition'. The plasma can be confined in the vicinity of the target surface by means of magnetic fields originating from magnets placed at the side of the target opposite to the plasma side, a process referred to as 'magnetron sputter deposition'. The target can be fed with a direct current, pulsed direct current or alternating current power source. When now a reactive gas is admitted to the argon, a compound layer will be formed at the surface of the substrate, a process referred to as 'reactive magnetron sputter deposition'. In another variant of the 'magnetron sputter deposition', the magnetron can be made 'unbalanced' as opposed to 'balanced'. With 'unbalanced' is meant that part of the magnetic field lines do not close on the target surface but fan out to the substrate. Electrons gyrating around these field lines then can reach the substrate and create a local plasma. Such a process is called 'unbalanced magnetron sputtering'.

The ion current towards the substrate can be controlled by properly biasing the substrate with respect to the rest of the installation or by isolating the substrate making it floating with respect to the rest of the installation. In the latter case a self-bias will then develop that attracts ions to the substrate. Such a current of impinging ions leads to a further densification of the deposited layer, a process that is known as 'ion plating'.

Chemical vapour deposition is in essence a process in which a gaseous precursor—usually a hydrocarbon—is excited so that radicals form that subsequently chemically react at the surface of the blank or already coated substrate. Excitation of the gaseous precursor can be achieved with a variety of means:

By thermal activation of the precursor. Heating of the gas can be achieved by heating the substrate or the walls of the reactor, or by using heater wires (hot wire CVD). Using heater wires has the additional advantage that thermally emitted electrons add to the activation degree of the precursor gas.

By irradiation with visible (photochemical vapour deposition), infrared or microwave electromagnetic waves.

Through excitement in a plasma (plasma activated CVD, PA CVD). To this end a noble gas atoms, usually argon, is mixed with the precursor gas in order to generate a plasma, that subsequently generates radicals in the precursor gas. The plasma can be excited by means of a radiofrequent electromagnetic field (typically 13.56 MHz).

A variant to this technique uses an unbalanced magnetron to fan out the plasma towards the substrate so that—in addition to the chemical deposition—ion plating occurs.

Many times, different modes of activation are mixed in order to control coating properties or to enhance the speed of coating.

For the purpose of this application, a process will be considered to be:

a PVD process as long as atoms are being dislodged from the target a CVD process as long as precursor gas radicals are present in the apparatus a 'mixed process' when target atoms are being dislodged while organic precursor molecules are present.

More and more technologically important coatings are being produced involving complex stacks of layers deposited by PVD, reactive PVD and CVD and gradient layers that involve a mixture of both processes at the same time. One such a stack is e.g. described in WO 2005/014882 wherein first a Ti layer is deposited on a substrate (by means of magnetron sputtering), followed by a layer of TiN (by means of reactive magnetron sputtering), followed by a Ti layer that gradually changes from a TiC (mixed process) into a diamond like coating (DLC, chemical vapour deposition). The specific coatings are used as hard and wear resistant coatings in various applications.

The combination of both processes in one single apparatus poses many technological challenges to the equipment as the requirements of both processes are differing. For example, plasma sputtering processes normally take place at pressures between 0.01 and 100 Pa, whereas chemical vapour deposition processes can take place at pressures anywhere between 1 Pa and atmospheric pressure. Also the coating mechanism differs. In the PVD process, the flux of coating particles can be more or less directed towards the substrate. This necessitates the introduction of planetary carrousels to carry the substrates so that each and every spot on the sometimes complexly curved substrates is reached. The CVD process is based on diffusion and conformally coats the substrate. But it also tends to cover the whole deposition chamber including the sputtering target surface present in the chamber. This sputtering target surface gets covered with a CVD layer that disturbs the PVD process during the next use of the target.

The process control problems are particularly outspoken in the 'mixed mode' process wherein sputtering is combined with the administering of a mixture of an inert and precursor gas e.g. the sputtering of a Ti target in an acetylene ($C_2H_2$)-argon mixture to form a TiC layer. It turns out to be extremely difficult to reproducibly control the mixed process as a compound layer not only forms on the substrate, but also on the target which leads to undesirable phenomena like arcing (leading to the ejection of larger pieces out of a target) and instability of the process. Therefore a 'target contamination' problem exists in these processes.

Many reactors have been described that make possible 'mixed processes'. There is for example the coater described in WO01/79585 that shows planar magnetrons mounted at the outer walls of an evacuable chamber. Other sources for excitement of precursor gasses are provided in the form of a low-voltage arc that can be drawn between a hot filament cathode and an anode. Densification of the layer formed is provided with a pulsed DC excitation between substrate and plasma.

SUMMARY OF THE INVENTION

It is an object of the present invention to provide an apparatus that allows for a stable and controllable chemical vapour deposition process or physical vapour deposition process or both in the same reactor vessel. In addition the apparatus makes it possible to clean the physical vapour means without interference with the chemical vapour process. Another object of the invention is to provide an apparatus and a method that allows for a time-efficient process schedule.

According to a first aspect of the invention, an apparatus for coating substrates is presented. The apparatus is intended to provide substrates with a functional coating. The coating that is applied may impart specific desirable optical, electrical, magnetic, chemical or mechanical properties to the substrate. The apparatus is intended preferably to coat the substrate with mechanical functional coatings such as anti-friction coatings, wear resistant coatings and the like. More specifically the apparatus is especially—but not exclusively—intended to coat substrates with coatings comprising a stack of layers that are applied with different kinds of processes, notably CVD or PVD or a combination of both. Such stacks preferably comprise a layer of a metal out of the group IVB, group VB or group VIB of the periodic table, a layer of the carbide or nitride of said metal, a diamond like layer or a diamond like nanocomposite layer as they are known in the art.

Such an apparatus is in essence a chamber that is provided with the necessary ancillary equipment such as pumps, pressure gauges, feedthroughs to evacuate the chamber. The chamber is preferably of rectangular shape although this is not necessary for the invention as such: cylindrical, hexagonal or other shapes could be considered as well. Inside the chamber a device for carrying the substrates to be coated is present. Such a device is usually a planetary carrier that revolves the substrates in all possible directions with respect to the coating means. One or more means for establishing a chemical vapour deposition process are provided inside said chamber: hot wire heating sources, RF antennas to couple electromagnetic energy into the plasma, low voltage plasma arcs and the like. In addition one or more means for establishing a physical vapour deposition process are available in said apparatus. Contrary to the known apparatus that solely use planar magnetrons as physical vapour means, the inventive apparatus comprises at least one rotatable sputtering magnetron. Such rotatable sputtering magnetrons are known in the art although mainly in the field of large area sputtering. The use of such a rotatable magnetron in a mixed mode reactor has however not been considered hitherto.

Essentially, a rotatable sputtering magnetron comprises a target tube in which a magnet array is provided. The magnet field lines penetrate through the target tube and define a preferred sputter area at the outer surface of the target when the apparatus is operative. Minimally the outer layer of the target tube is made of the target material intended for sputtering. During operation one or more closed plasma loops called racetracks are formed at the surface of the target, reflecting the arrangement of the magnets in the magnet array. Radial under these racetracks the target material is eroded away very fast, while outside the racetracks, erosion is negligible. As in the racetracks, the target material is ejected away in a preferred direction, the placement of the magnet array should be such that it is directed towards the substrates to be coated.

The benefits of the rotatable magnetron vis-à-vis the planar magnetron become prominent when there is a relative motion between the target and the magnet array. Such a relative motion continuously feeds new material in the racetracks, leading to a uniform use of the target material on the backing tube. In addition, the relative movement reduces the formation of a compound layer on the target surface in the case of reactive sputtering or mixed mode vapour deposition. Indeed, first the formed compound layer is eroded away in the racetrack, revealing fresh target material that is subsequently sputtered. Consequently the target material contamination—or poisoning as it sometimes called—is reduced, leading to a more stable process even when working with very reactive gasses such as organic precursor gasses.

The magnet array can be of the balanced type. As the erosion in the racetrack is determined by the magnet array many types of magnet array configurations have been described. The magnet arrays are preferably of the directional type having one or more loops, the loops defining directions in which the material is preferentially sputtered away (such as described in U.S. Pat. No. 6,264,803). The magnet array can be of the unbalanced type thereby enabling a certain degree of ion-plating during physical vapour deposition or during mixed mode process.

According a preferred embodiment of the invention, the rotatable magnetron is held in a housing that can be mounted to a wall of the chamber. The housing is necessarily elongated as it has to hold the tubular magnetron. The substrates are coated through the opening connecting the housing to the chamber. The rotatable magnetron is mounted in between one or two end-fixtures. The end-fixtures are complex electro-mechanical modules that:

Provide rotatable mechanical support as well as rotative motion to the target.

Hold the magnet array in a fixed position relative to the chamber.

Transfer electricity to the target surface in order to attract ions out of the plasma.

Transfer coolant to the target and collect the returning coolant.

Maintain vacuum integrity while the target is rotating.

The use of a housing to mount the rotatable magnetron in is particularly advantageous as it allows the end-fixtures to protrude straight out of said housing. In this way the end-fixtures can be designed more simply and are very easy accessible for servicing from the outside. Preferably, although this is not mandatory for the invention, the magnetron or magnetrons are mounted vertically at a left or right wall of the chamber when facing the front of the chamber.

The exchange of the target tube enclosed in the housing is simplified by mounting the housing pivotable to the chamber. This can be done by means of for example heavy hinges as the weight of the housing and the target is considerable.

The processes inside the apparatus can be advantageously organised by the introduction of a shutter. Such a shutter can at least cover the sputtering zone of the magnetron. With 'sputtering zone' is meant that area on the target surface where a plasma forms when the magnetron is operative. The shutter is rotatably moveable around the magnetron. However, it is not necessary that the shutter and the magnetron share the same axis. It is more convenient that the shutter axis is eccentric with respect to the magnetron axis.

The shutter can be conveniently driven from the outside of the housing by means that are mounted at the outside of the housing. The shutter is preferentially made out of an electrically conductive material, although dielectric materials could be envisaged too (such as e.g. glass, preferably high temperature resistant glass such as fused quartz like Pyrex®). By preference the shutter is made of metal, notably a high temperature resistant metal such as stainless steel or a titanium alloy or even certain aluminum alloys. Other metals or alloys are also possible when e.g. the thickness is adapted to withstand the plasma environment over a sufficiently long time. The shutter may be electrically floating with respect to the environment, but more preferred is if the electrical potential of the shutter can be controlled relative to one of following references: the potential of the chamber or the potential of the target or the potential of the substrates. Most preferred is if the shutter and the chamber are held at the same potential.

By preference the gap between target sputtering zone and shutter at the sputtering zone is sufficiently large to allow for a plasma to ignite. Before a plasma ignites various conditions have to be met. The gas density (controlled by the pressure) must be low enough in order to have a sufficient mean free path for the ions to accelerate and liberate secondary electrons from the cathode. On the other hand the gas density must not be too low as otherwise not enough collisions take place. The field strength must be high enough and the mean free path of the electrons must be long enough to allow electrons to gain sufficient energy to ionise the neutral atoms in the gas. While in the plasma there is charge balance between electrons and ions, and hence the potential is relatively constant, this is not so in the vicinity of the target cathode where most of the potential drops. There, a dark space will form above the target surface as electrons gain their kinetic energy and are not able to ionise the gas atoms. When the gap between magnetron and shutter is smaller than this dark space thickness, no plasma will start. The person skilled in the art knows this delicate balance of parameters and knows that a certain gap width is needed in order to ignite a plasma there. The gap has only to be sufficiently wide there where the plasma forms i.e. above the sputtering zone. Outside the racetrack, the gap can be much less as there no plasma will form anyhow.

For practical attainable voltages and current densities, the inventors have found that a minimum distance of 3 cm suffices to ignite a plasma between the magnetron and the shutter. More preferred is a distance of 4 or even 5 cm. Large distances are more preferred but this requirement collides with the space limitations inside such an apparatus. The eccentric placement of the shutter relative to the magnetron helps to increase that distance without having to increase the housing.

As the opening in the housing may impede the accessibility of such a shutter the inventors have found that it is best to make this shutter in a modular way. Each of the pieces forming the shutter is made sufficiently small as to be removable through the opening. The pieces can be assembled in the housing by means of any known fastening means such as screws, clips, hooks, nut and bolts or the like as long as they can be easily fastened or opened.

Further provisions in the apparatus are foreseen to have a separate gas feed between the target and the tubular shutter. Such a gas feed preferably feeds a noble gas in between the gap between the magnetron and shutter. When now the shutter sufficiently closes the opening between the housing and the chamber, a separate gas atmosphere can be maintained around the target, differing from the gas atmosphere present in the chamber. This feature is particularly helpful to clean the target surface. It is also helpful to prevent the contamination of the target when it is not in use.

According a second aspect of the invention a time-efficient process schedule is provided. As usually the coating of the substrates is a batch process, a lot of time is spent with pumping down of the chamber, heating of the chamber, sputter cleaning, venting etc. . . . It is therefore advantageous to reduce these steps or to make them concurrently. A method to coat substrates comprises the following steps:

a.) First the substrates are attached to the substrate carriers. The carriers are then loaded on the planetary substrate holder in the chamber.

b.) The chamber is pumped down to a base pressure. The chamber may in the meantime be flushed with argon gas. Also the substrates can be subjected to a plasma etch by applying the proper bias to them.

c.) A predetermined sequence of coating processes is initiated and a layered coating stack is formed on said substrates. The processes are chosen out of the group of sputter deposition, reactive sputter deposition, and chemical vapour deposition or a combination thereof. By preference the sequence will be: sputter deposition, reactive sputter deposition, reactive sputter deposition in combination with chemical vapour deposition, chemical vapour deposition with a hydrocarbon precursor gas. During each process step, the necessary process conditions such as target potential, substrate bias, gas pressures and flows, temperatures, rotation speeds of the planetary substrate holder and others are controlled.

d.) When the stack is completed, all coating processes are stopped.

e.) The chamber is vented—preferably with nitrogen or air, but other gases can be used as well—and cooled down and the substrates on their carriers are removed from the chamber.

Inventive about this process is that at any moment there is the possibility to introduce between the steps or perform concurrently during a step the substeps of:

Having the shutter turned to cover the area where sputtering will occur. The shutter can already be in that position or it can be brought in that position.

Realising the appropriate gas pressure between magnetron and shutter so that a plasma can be ignited.

Ignition of a plasma between magnetron and shutter by feeding electrical power to the magnetron.

While the plasma is on, one can turn the shutter back. This is useful when depositing the first metallic layer: first the target is cleaned and one waits until a stable plasma is obtained. Thereafter the shutter is turned away and the substrates become coated. Such a procedure has the benefit that the plasma deposition is stabilised from the start. Or one can chose to leave the shutter in front of the sputtering zone e.g. when the chemical vapour deposition is in progress. The plasma can be ignited for cleaning the target at the end of a coating procedure, while the shutter remains in the closed position.

Extinguishing said plasma. This can occur due to too low pressure (as during pump down cycle) or can be done by switching of the magnetron power. The shutter can be left in the covering position in order to prevent target contamination by the other process steps.

The above substeps can be performed between and including the main steps 'b' to 'e'. Cycle time can be saved when the above substeps are performed during the main steps. For example when pumping down (main step 'b') and purging with argon gas between target and shutter, the right pressure (typically 1 Pa) will be reached at a certain moment in time to ignite the plasma by energising the magnetron. The shutter must be turned over the sputtering zone to prevent that the substrates become contaminated. While now the pressure is further being reduced, the plasma will extinct somewhere around 0.01 Pa. The system can then be further evacuated in order to reach a base pressure of typically 1 mPa.

A cleaning step as described above has the advantage that the target cleaning is over the entire target surface, without the need to remove the target and as a part of the process cycle. This is not possible with planar targets. When using a planar target, the target material is only abraded away in the racetrack. During use a compound layer forms outside the racetrack. This compound layer can only be removed off-line i.e. a cleaning step is needed wherein the compound layer is mechanically removed from the target (e.g. by means of a metal brush or sand paper).

Another disadvantage of the planar target is that when reactive gasses, such as organic precursors, are admitted while sputtering, the racetrack itself becomes more and more covered with compound material until the process suddenly switches from a metallic mode to a compound mode with highly differing characteristics in term of type and amount of material deposited. This problem is much less when using rotatable magnetrons as the racetrack is moved relative to the target thereby first abrading away the compound layer that could have formed on the target surface. Also considerably more power can be fed to a rotatable magnetron compared to a planar magnetron as the cooling of a rotatable magnetron is more efficient because the heat is spread over the complete surface of the target. This makes it possible to coat faster in physical vapour or mixed mode deposition steps of the process.

In case the shutter completely covers the magnetron, even more flexibility is possible: one can e.g. have an argon atmosphere within the shutter and maintain a plasma there while outside the shutter a chemical vapour deposition process takes place with an organic precursor gas. The argon leaking out of the shutter can be used to ionise the precursor gas. In this way process steps can be concurrently run.

BRIEF DESCRIPTION OF THE DRAWINGS

The invention will now be described into more detail with reference to the accompanying drawings wherein.

DESCRIPTION OF THE PREFERRED
EMBODIMENTS OF THE INVENTION

In what follows, the last two digits of the reference numbers refer to equal or like parts of the apparatus, while the first digit refers to the number of the figure.

Figure 1:
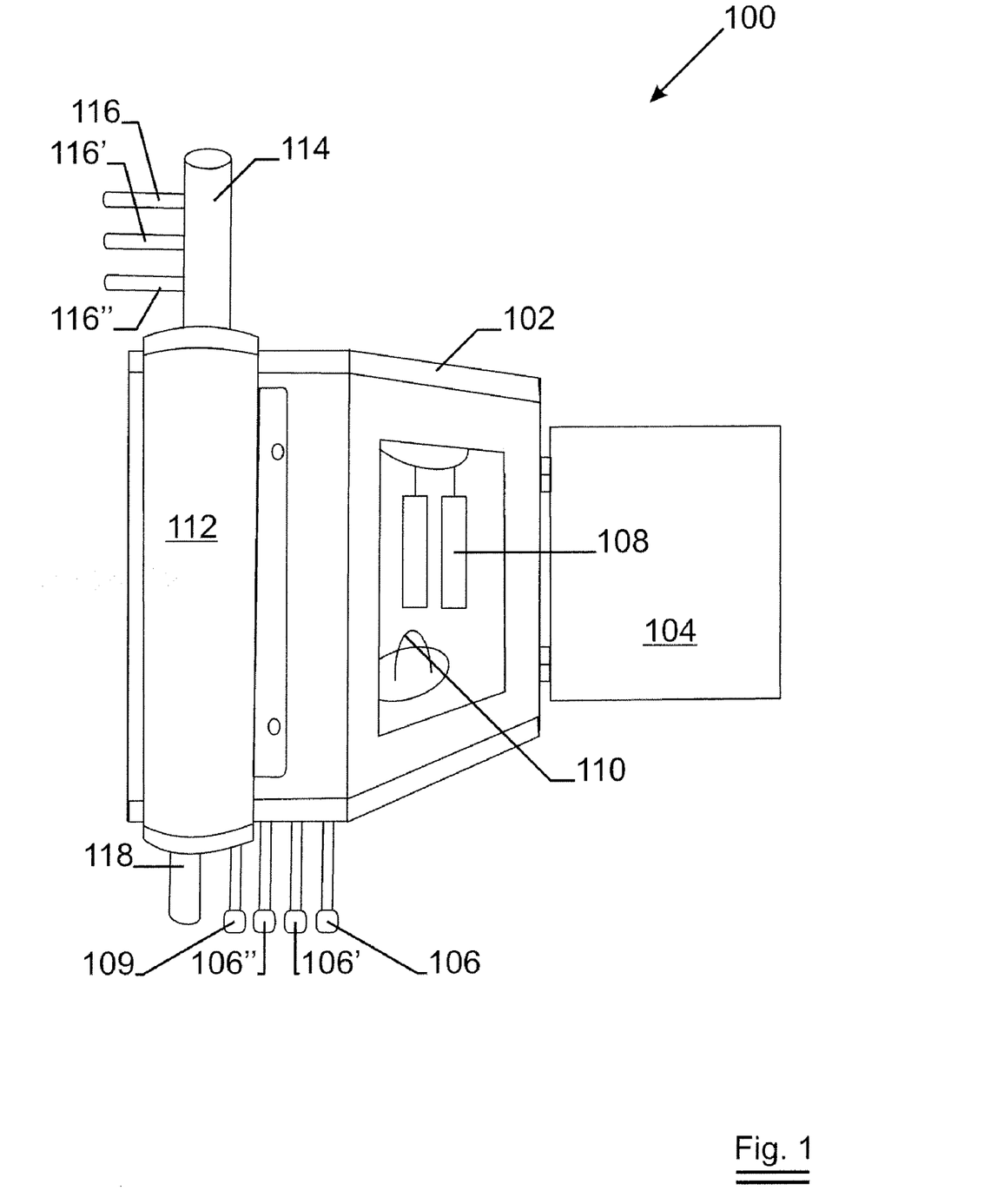
FIG. 1 shows a schematic overview of the coating apparatus according the invention.

FIG. 1 shows a first embodiment of a coating apparatus 100 according the invention. In this embodiment the evacuable chamber 102 has the typical rectangular shape of a box-coater. Such a box-coater is provided with a door 104 giving access to the planetary substrate holder 108 on which substrates are hung. In this embodiment excitement of the precursor gasses during chemical vapour deposition is achieved with a RF excitation means possibly assisted with heating wires 110. The chamber 102 is evacuable by means of (not shown) vacuum pumps while the vacuum or gas atmosphere is monitored by means of the known types of pressure gauges and gas sensors (not shown). Different gasses are fed to the chamber in amounts controlled by mass flow controllers (not shown) through gas feeds 106, 106', 106". The rotatable magnetron is mounted inside a housing 112 provided at the side-wall of the chamber. The end-fixture 114 is mounted in line with the axis of the magnetron. The end-fixture 114 feeds electricity, coolant—through feedthroughs 116, 116', 116"—and motion to the target inside the housing. The shutter 224 inside the housing 112 can be moved through the end-fixture 118. A separate gas supply 109 supplies gas in the gap between shutter and magnetron. It is evident that other magnetrons in their respective housing can be attached to the same evacuable chamber on the other walls.

Figure 2:
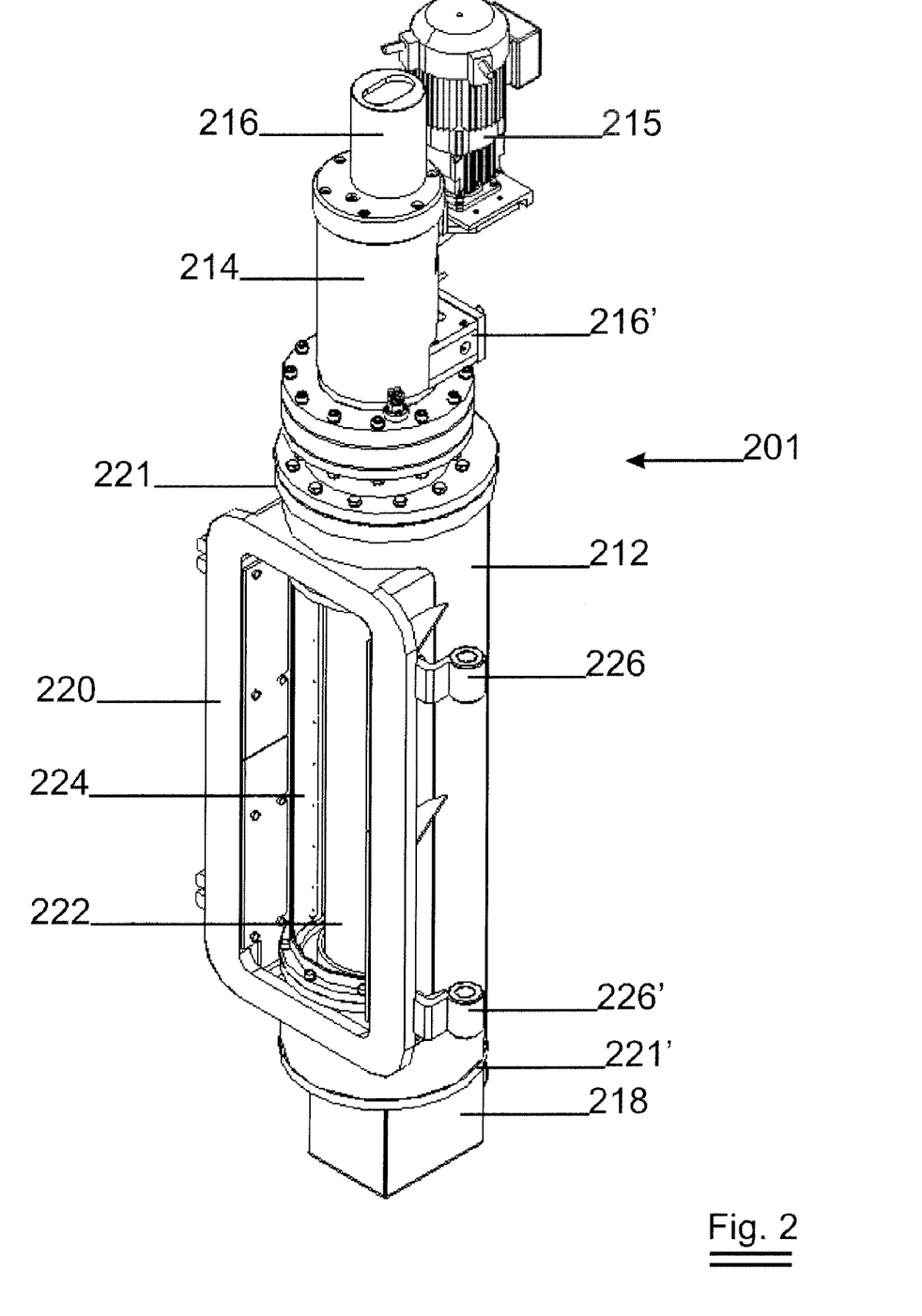
FIG. 2 shows a perspective engineering drawing of the housing with the rotatable magnetron and the shutter.

A detailed engineering drawing of the magnetron in its housing 201 is shown from a perspective viewpoint in FIG. 2. Basically the housing 212 of the magnetron 222 is a stainless steel tube with flanges 221, 221' on which the end-fixtures 214 and 218 are mounted. An opening is provided bordered by a mounting flange 220 for mounting the housing 201 vacuum-tight to the chamber 102. Through the opening, material sputtered from the magnetron 222 enters the chamber 102 and coats the substrates attached to the substrate holders 108. The magnetron 222 comprises a rotatable target inside of which a stationary magnet array (not shown) is mountable that directs the sputtering of the atoms through the opening. The housing with all equipment attached to it can be turned away from the evacuable chamber by means of the sturdy hinges 226, 226' for easy servicing of target and shutter.

At either end of the housing an end-fixture 214 and 218 is mounted to end flanges 221, 221'. In this embodiment the upper end-fixture 214 transfers motion from the motor 215 to the target while maintaining the vacuum integrity of the housing 212. Coolant is supplied and extracted through coolant connection 216. Electricity is fed to the target through electrical connector 216'. Inside the housing 212 a tubular-shaped rotatable shutter 224 is provided. FIG. 2 shows the shutter in the open position when an elongated opening in said tubular shutter 224 is turned in front of the sputtering area of the rotatable magnetron 222. The shutter is activated through end-fixture 218 from the outside of the housing. The activation of the shutter is e.g. through a small electrical motor that is activated by an electronic control unit (not shown) such as a PLC or computer in function of the process chosen. In this embodiment the magnetron and the shutter are mounted eccentrically to one another. Although this is preferred, this is no prerequisite of the invention.

Other embodiments wherein the functionalities of the end-fixtures are differently distributed are also possible such as:

- the shutter is controlled by the upper end-fixture, while the target is driven by the lower end-fixture which makes it more easy to drain the water out of the target in case it has to be replaced.
- the electrical feed to the magnetron is incorporated together with the shutter driver in the same end-fixture (under the proviso that magnetron and driver are concentrically mounted).
- the coolant feed and extraction is split over the upper and lower end-fixture, cold coolant being fed for example from the bottom and extracted through the top The person skilled in the art can readily devise other equivalent distributions of functionalities that give the same overall result without extending out of the scope of the invention.

Figure 3:
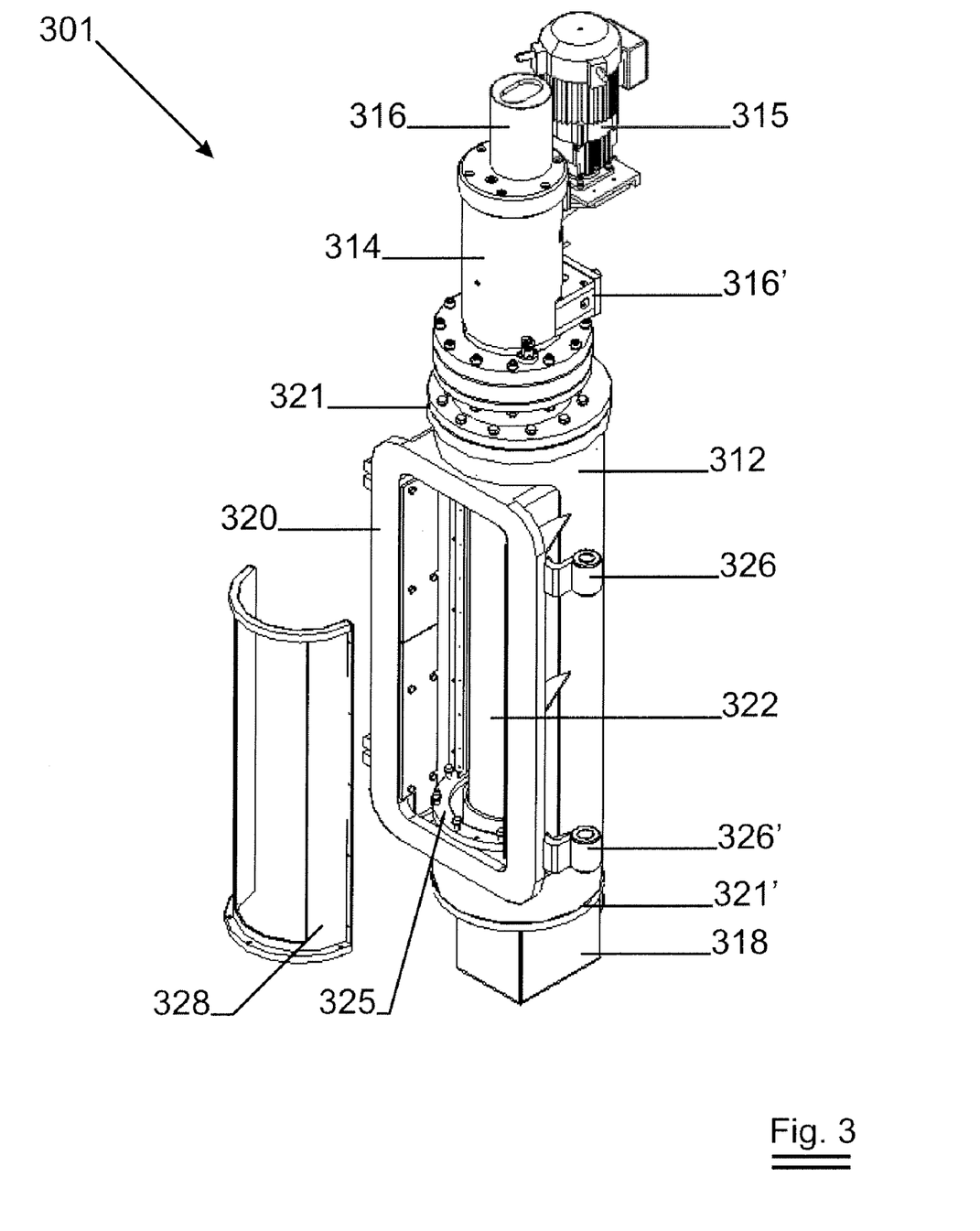
FIG. 3 shows how a first part of the shutter can be removed.

FIG. 3 shows in detail how the shutter is designed and how it can be removed from the housing. The shutter 224 is made out of two tubular halves 328 and 429 of which one 328 has an elongated opening. Both halves 328, 429 are carried by a collar 325 that on its' turn is driven through the end-fixture 318. The halves are attached to collar 325 by means of bolts.

Figure 4:
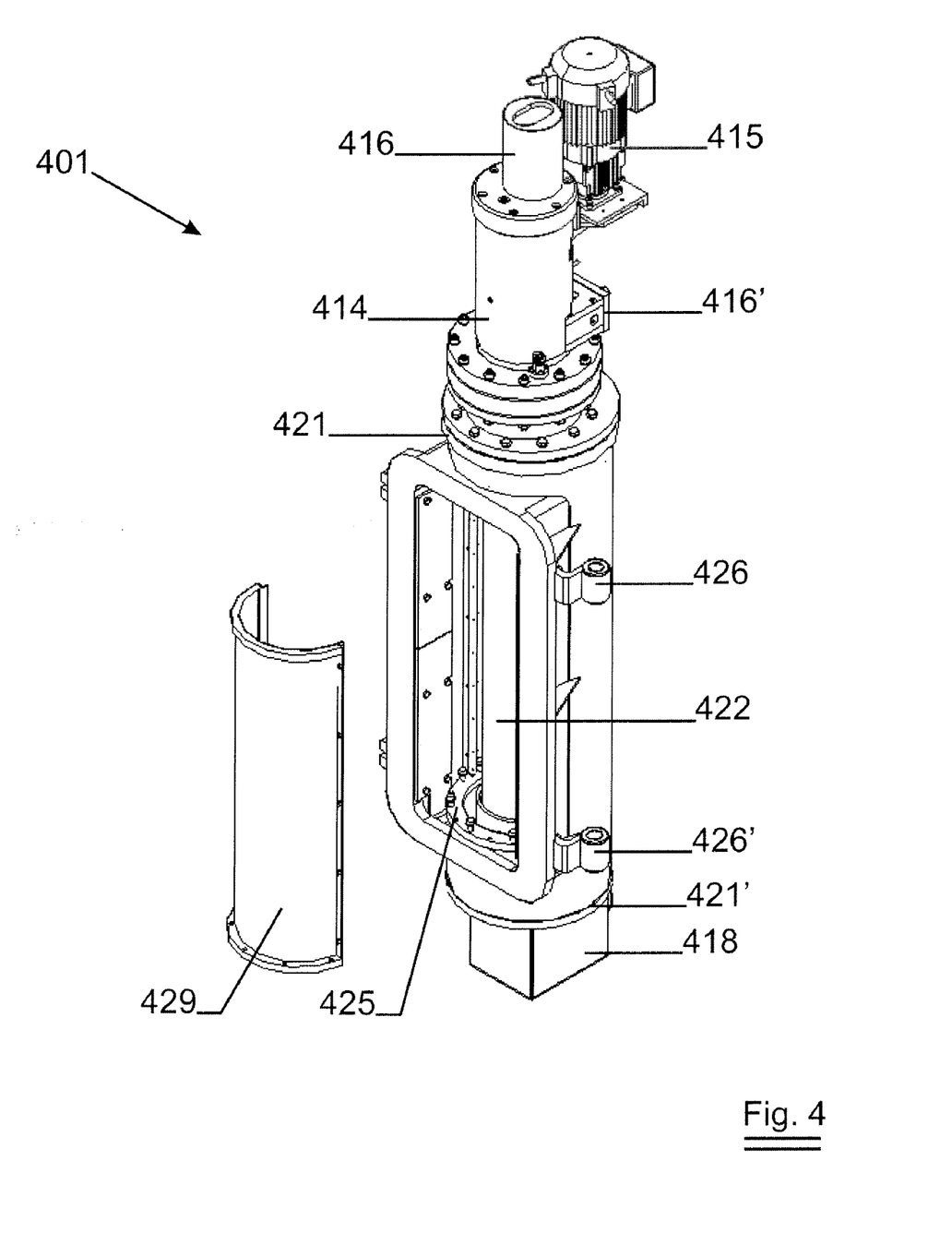
FIG. 4 shows how a second part of the shutter can be removed.

The two halves 328 and 429 are screwed to one another. FIG. 4 shows the same as FIG. 3 but there it is shown how the full part 429 is removed.

A typical coating procedure for a wear resistant coating based on a titanium adhesion layer is described below. Prior to coating, the substrates are mounted on the substrate holders of the planetary carousel. First the chamber is pumped down to a base pressure of lower than 0.01 Pa. A short argon plasma etch is used to clean the rotating substrates. A RF power source is coupled to the substrates in order to generate a local plasma for cracking the organic precursor gas. The shutter is kept closed while argon is admitted to a pressure of about 1 Pa and a DC voltage is applied to the Ti target. When the right conditions are reached, a plasma will ignite between shutter and target. The shutter is kept closed for about 5 minutes to clean the rotating Ti target surface from oxides formed during exposure to the atmosphere and to stabilise the sputtering process. Thereafter, the shutter is opened and the base layer of Ti is sputtered onto the substrates. Once the Ti base layer is formed, a carbon containing organic precursor gas such as ethyne is admitted to the chamber at an increasing rate. At the same time the power applied to the Ti-target is gradually diminished. During this faze the process is a mixed process as both Ti atoms are dislodged from the target while the organic precursor molecules are cracked down by the combined action of the sputter plasma and the RF power source. As the sputtering power gradually diminishes the chemical vapour deposition process takes over from the physical vapour deposition process. Concurrently the bias of the substrates is increased to increase the amount of ion-plating. In this way a gradient layer of Ti with diamond like carbon is formed, the amount of Ti decreasing with increasing layer thickness. During this mixed process, no arcing is observed despite the presence of the reactive organic precursor gas that would normally form a compound layer on the non-sputtered part of planar target. Also the sputtering process remains stable and there is no poisoning of the target surface. The process when using a rotatable magnetron is therefore more stable compared to when planar magnetrons are used. Once the mixed process is finished, the shutter is closed and the remainder of the stack is grown by means of chemical vapour deposition only. At the end of the cycle, argon is admitted to the magnetron shutter gap and the target surface is cleaned by a plasma, in an 'après-sputter' step, so that the target surface is in a clean state when starting the next cycle. No additional offline cleaning of the target is therefore necessary.

While the invention has been particularly shown and described with reference to certain preferred embodiments, it will be understood by those skilled in the art that various operations and modifications in form and detail may be made therein.

The invention claimed is:

1. A coating apparatus for coating substrates comprising:
an evacuable chamber and, means for establishing a physical vapour deposition process and, means for establishing a chemical vapour deposition process wherein said means can be operated alternatively or concurrently inside said chamber
wherein said physical vapour deposition means comprises one or more rotatable sputtering magnetrons for enabling a stable process of combined physical and chemical vapour deposition on said substrates
wherein a sputtering zone of at least one of the rotatable sputtering magnetrons is coverable by a tubular shutter that is rotatably moveable around said rotatable sputtering magnetron, and
wherein said tubular shutter is eccentrically mounted to said rotatable sputtering magnetron.

2. The coating apparatus of claim 1, wherein said rotatable sputtering magnetron is enclosed in a housing mountable to a wall of said evacuable chamber, said housing having an opening for sputtering from said rotatable sputtering magnetron into said chamber through said opening.

3. The coating apparatus of claim 2, wherein said housing is pivotably attached to said chamber.

4. The coating apparatus of claim 2, wherein said housing further includes an end fixture configured to rotate, cool, and energize said sputtering magnetron, said end fixture being axially mountable to said sputtering magnetron at the outside of said housing.

5. The coating apparatus according to claim 2, wherein said housing further includes an end fixture configured to rotate said shutter, said end fixture being mountable to said sputtering magnetron at the outside of said housing.

6. The coating apparatus according to claim 1, wherein said shutter is made of a conductive material and is electrically biassable with respect to said magnetron.

7. The coating apparatus according to claim 1, wherein said magnetron and said shutter are separated by a gap at said sputtering zone, said gap being wide enough to ignite a plasma between said magnetron and said shutter.

8. The coating apparatus according to claim 1, wherein said shutter is assemblable out of comprises one or more pieces.

9. The coating apparatus according to claim 1, wherein a gas feed is present between said magnetron and said shutter.

10. The coating apparatus according to claim 9, wherein said shutter is configured to close an opening between said rotatable sputtering magnetron and said chamber to maintain a gas atmosphere between said magnetron and said shutter when said shutter covers said sputtering zone, said gas atmosphere being different than a gas atmosphere in said chamber.

11. The coating apparatus according to claim 1, wherein said rotatable sputtering magnetron is of the balanced type.

12. The coating apparatus according to claim 1, wherein said rotatable sputtering magnetron is of the unbalanced type.

13. A coating apparatus for coating a substrate comprising:
an evacuable chamber,
a magnetron apparatus configured to establish a physical vapour deposition process, and
a chemical vapour deposition apparatus configured to establish a chemical vapour deposition process,
wherein said magnetron and said chemical vapour deposition apparatus are configured to operate alternatively or concurrently inside said chamber,
wherein said magnetron apparatus comprises one or more rotatable sputtering magnetrons configured to enable a stable process of combined physical and chemical vapour deposition on a substrate,
wherein a sputtering zone of at least one rotatable sputtering magnetron is coverable by a tubular shutter that is rotatably moveable around said rotatable sputtering magnetron, and
wherein said tubular shutter is eccentrically mounted to said rotatable sputtering magnetron.

14. The coating apparatus of claim 13, wherein said rotatable sputtering magnetron is enclosed in a housing mountable to a wall of said evacuable chamber, said housing having an opening for sputtering from said rotatable sputtering magnetron into said chamber through said opening.

15. The coating apparatus of claim 14, wherein said housing is pivotably attached to said chamber.

16. The coating apparatus of claim 14, wherein said housing further includes an end fixture configured to rotate, cool, and energize said sputtering magnetron, said end fixture being axially mountable to said sputtering magnetron at the outside of said housing.

17. The coating apparatus according to claim 14, wherein said housing further includes an end fixture configured to rotate said shutter, said end fixture being mountable to said sputtering magnetron at the outside of said housing.

18. The coating apparatus according to claim 13, wherein said shutter is made of a conductive material and is electrically biassable with respect to said magnetron.

19. The coating apparatus according to claim 13, wherein said magnetron and said shutter are separated by a gap at said sputtering zone, said gap being wide enough to ignite a plasma between said magnetron and said shutter.

* * * * *